(12) United States Patent
Motonari et al.

(10) Patent No.: US 7,153,369 B2
(45) Date of Patent: Dec. 26, 2006

(54) METHOD OF CHEMICAL MECHANICAL POLISHING

(75) Inventors: Masayuki Motonari, Chuo-ku (JP); Masayuki Hattori, Chuo-ku (JP); Nobuo Kawahashi, Chuo-ku (JP)

(73) Assignee: JSR Corporation, Tokyo (JP)

(\*) Notice: Subject to any disclaimer, the term of this patent is extended or adjusted under 35 U.S.C. 154(b) by 0 days.

(21) Appl. No.: 10/200,504

(22) Filed: Jul. 23, 2002

(65) Prior Publication Data

US 2002/0193451 A1  Dec. 19, 2002

Related U.S. Application Data

(63) Continuation of application No. 09/638,062, filed on Aug. 15, 2000, now abandoned.

(30) Foreign Application Priority Data

Aug. 18, 1999 (JP) .................................. 11-231668
Aug. 18, 1999 (JP) .................................. 11-231669

(51) Int. Cl.
*C23G 1/14* (2006.01)
*C09G 1/02* (2006.01)
*C09K 3/14* (2006.01)
*H01L 21/321* (2006.01)

(52) U.S. Cl. .............................. 134/2; 134/7; 134/902; 438/693; 51/298

(58) Field of Classification Search ............... 510/175; 134/1.3, 902; 148/251, 257; 524/815; 438/693; 423/DIG. 14; 51/298
See application file for complete search history.

(56) References Cited

U.S. PATENT DOCUMENTS

| | | | |
|---|---|---|---|
| 3,070,510 A | * 12/1962 | Cooley et al. | |
| 3,941,793 A | * 3/1976 | Ackerley et al. | 423/DIG. 14 X |
| 4,947,591 A | * 8/1990 | Risley | 51/298 X |
| 6,068,769 A | 5/2000 | Iio et al. | 210/315 |
| 6,238,592 B1 | * 5/2001 | Hardy et al. | 438/693 X |
| 6,432,828 B1 | * 8/2002 | Kaufman et al. | 438/693 |
| 6,440,856 B1 | * 8/2002 | Bessho et al. | 510/175 X |
| 6,447,563 B1 | * 9/2002 | Mahulikar | 438/693 X |
| 6,447,695 B1 | 9/2002 | Motonari et al. | 252/79.1 |
| 6,454,819 B1 | * 9/2002 | Yano et al. | 438/693 X |
| 6,565,767 B1 | * 5/2003 | Hattori et al. | 438/693 X |
| 6,579,153 B1 | * 6/2003 | Uchikura et al. | 438/692 |
| 2001/0049912 A1 | * 12/2001 | Motonari et al. | 51/307 |
| 2002/0005017 A1 | * 1/2002 | Motonari et al. | 51/307 |

FOREIGN PATENT DOCUMENTS

| | | |
|---|---|---|
| EP | 0 919 602 A1 * | 6/1999 |
| EP | 1 020 488 B1 * | 7/2000 |
| WO | WO 98/49723 * | 11/1998 |

\* cited by examiner

*Primary Examiner*—Daniel S. Metzmaier
(74) *Attorney, Agent, or Firm*—Oblon, Spivak, McClelland, Maier & Neustadt, P.C.

(57) ABSTRACT

It is an object of the invention to provide an aqueous dispersion for CMP that produces no scratches on polishing surfaces and that polishes with an adequate rate, when used for polishing of copper and the like. The aqueous dispersion of the invention contains water and polymer particles composed of a polymer with a specific functional group, and it may also contain a complexing agent, a compound that forms a passivation film on polishing surfaces and/or an oxidizing agent. The specific functional group is a functional group that can react with the metals of polishing surfaces or that can form a cation, and it is preferably selected from among amino, pyridyl and acrylamide groups. The polymer can be obtained using a initiator and/or monomer possessing the specific functional group. The polymer may also have a crosslinked structure.

29 Claims, 1 Drawing Sheet

METHOD OF CHEMICAL MECHANICAL POLISHING

This application is a continuation of application Ser. No. 09/638,062, Filed on Aug. 15, 2000, now abandoned.

BACKGROUND OF THE INVENTION

1. Field of the Invention

The present invention relates to an aqueous dispersion composition for chemical mechanical polishing (hereunder referred to as "aqueous dispersion") that is useful in the manufacture of semiconductor devices. More specifically, the invention relates to an aqueous dispersion prepared by dispersing in water polymer particles having functional groups that can react with the metals of polishing surfaces (particularly functional groups that can form cations), which is suitable for polishing of working films and the like in semiconductor devices.

2. Description of the Prior Art

Improved integration and increased multilayer wiring of semiconductor devices have led to introduction of a certain type of chemical mechanical polishing (hereunder referred to as "CMP") technique for polishing of working films and the like. This is a process whereby a wiring material such as tungsten, aluminum, copper or the like is embedded in a hole or groove formed in an insulator film on a processing wafer and then polishing is performed to remove the excess wiring material to thereby form the wiring. In this polishing technique, aqueous dispersions containing abrasive particles made of silica or metal oxides have conventionally been used as polishing materials. However, the abrasive particles have high hardness and have therefore presented the problem of creating scratches and dishing on polishing wafer surfaces, thus lowering the reliability of the LSI. A particularly emphasized area of research is focused on control of scratches and the like in porous insulator films with low hardness that are currently being studied for use.

In order to inhibit creation of scratches and the like, the use of polymer particles as abrasive particles has been proposed. Japanese Laid-open Patent Publication No. 270400 of 1998 describes a polishing material for manufacture of semiconductor devices that comprises an aqueous emulsion containing vinyl compound polymer particles obtainable by emulsion polymerization. Here, 2,2-azobis(2-aminopropane) hydrochloride is mentioned as an example of the polymerization initiator for emulsion polymerization. This compound, however, is only given as an example of a polymerization initiator, and there is no mention whatsoever regarding whether it has any other effects. Also, Japanese Laid-open Patent Publication No. 168431 of 1998 discloses a polishing slurry containing abrasive particles coated with a polyelectrolyte. However, the abrasive particles are inorganic particles. Moreover, it is also suggested that the polishing rate is reduced when the particles are totally covered with the polyelectrolyte.

SUMMARY OF THE INVENTION

[Problems to be Solved by the Invention]

It is an object of the present invention to provide an aqueous dispersion for CMP that contains particles comprising a polymer with specific functional groups. In particular, the object of the invention is to provide an aqueous dispersion that produces no scratches or the like on polishing surfaces, whether they are metal surfaces such as copper that have low hardness or porous insulator films of low hardness, and that provides both suitable etching rate and adequate polishing rate and is useful for polishing of working films and the like in semiconductor devices.

[Features of the Invention]

In order to achieve the aforementioned objects, the aqueous dispersion for CMP according to the first aspect of the invention is characterized by comprising polymer particles and water, wherein the polymer particles are composed of a polymer with a functional group in the molecule that can react with the metal of the polishing surface.

Here, "react" means to form a chemical bond such as a covalent bond, ionic bond or coordinated bond. The type of "metal of the polishing surface" will differ depending on the purpose for which the aqueous dispersion of the invention is used, and it may be a pure metal, an alloy or a metal oxide, metal nitride or another metal compound. The type of "functional group" is not particularly restricted so long as it can react with the metal of the polishing surface, and for example, a functional group that can form a cation is preferred.

The aqueous dispersion for CMP according to the second aspect of the invention is characterized by comprising polymer particles and water, wherein the polymer particles are composed of a polymer with a functional group in the molecule that can form a cation.

Here, "can form a cation" means that when used in the aqueous dispersion of the invention, at least a portion of the functional group is ionized to form a cation.

The polymer may be one having a crosslinked structure.

The aqueous dispersion of the invention may also be one containing a complexing agent, one containing a compound that can form a passivation film on polishing surfaces, or one that contains an oxidizing agent. The functional group may also be specified as at least one type from among amino, pyridyl and acrylamide groups.

The polymer used is preferably one obtained using a polymerization initiator and/or monomer that allows introduction of the functional group into the molecule.

[Effect of the Invention]

The aqueous dispersion for CMP of the invention allows polishing at a sufficient rate, particularly when polishing semiconductor device working films and the like (for example, copper films and low permittivity insulator films), without creating scratches on the polishing surface.

DETAILED DESCRIPTION OF THE INVENTION

Figure 1:
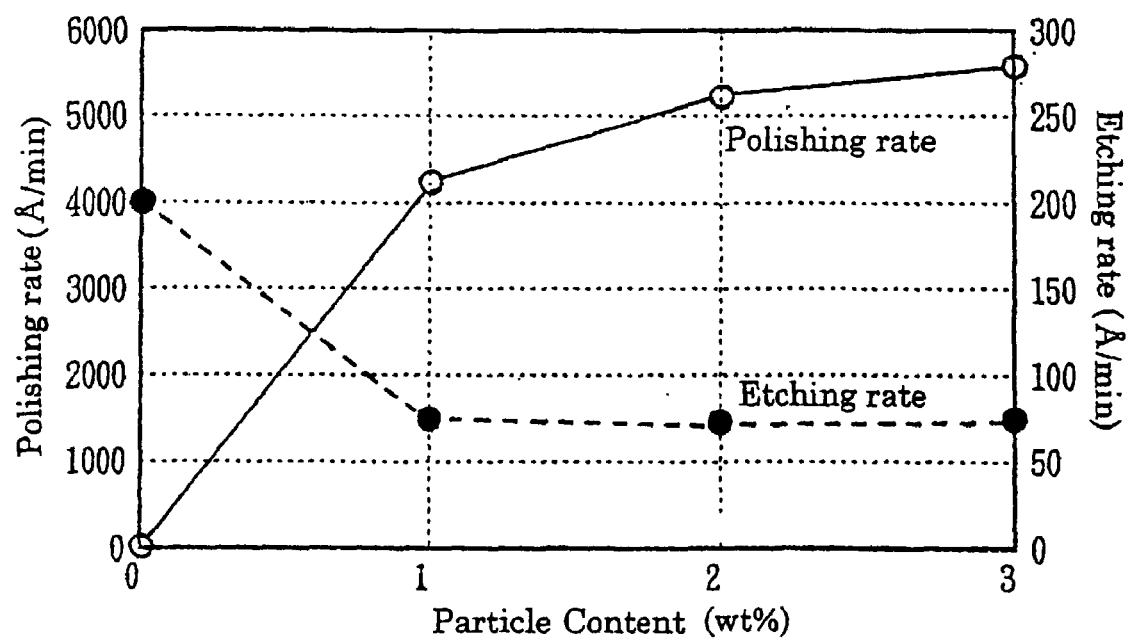
FIG. 1 is graph showing the relationship between polymer particle content and polishing rate/etching rate, for polishing of a copper film using the aqueous dispersion containing polymer particles according to Synthesis Example 1.

The invention will now be explained in further detail.

The mean particle size of the polymer particles in the aqueous dispersion of the invention is preferably 0.01–10 µm, more preferably 0.01–5 µm and even more preferably 0.01–3 µm. If the mean particle size of the polymer particles is less than 0.01 µm the polishing rate will be reduced. On the other hand, if the mean particle size is greater than 10 µm, the polymer particles precipitate more readily, making it difficult to obtain a stable aqueous dispersion. Their mean particle size may be measured by observation with a transmission electron microscope and the like.

When the polymer particles are made of a polymer "having a crosslinked structure" the polymer may be synthesized, for example, by copolymerization of a crosslinkable monomer and another monomer.

As the "crosslinkable monomer" there may be used a compound having two or more copolymerizable double bonds in the molecule, for example, a divinyl compound of which divinylbenzene is representative, or a polyvalent acrylate compound of which ethyleneglycol diacrylate, ethyleneglycol dimethacrylate, trimethylolpropane triacrylate and trimethylolpropane trimethacrylate are representative. These crosslinkable monomers may be used alone or in combinations of two or more.

As the "polyvalent acrylate compound" there may be used any of the following ones in addition to those mentioned above.

[1] Diacrylate Compounds

Polyethyleneglycol diacrylate, 1,3-butyleneglycol diacrylate, 1,6-hexaneglycol diacrylate, neopentylglycol diacrylate, polypropyleneglycol diacrylate, 2,2'-bis(4-acryloxypropyloxyphenyl)propane, 2,2'-bis(4-acryloxydiethoxyphenyl)propane.

[2] Triacrylate Compounds

Trimethylolethane triacrylate, tetramethylolmethane triacrylate.

[3] Tetraacrylate Compounds

Tetramethylolmethane tetraacrylate.

[4] Dimethacrylate Compounds

Diethyleneglycol dimethacrylate, triethyleneglycol dimethacrylate, polyethyleneglycol dimethacrylate, 1,3-butyleneglycol dimethacrylate, 1,4-butyleneglycol dimethacrylate, 1,6-hexaneglycol dimethacrylate, neopentylglycol dimethacrylate, dipropyleneglycol dimethacrylate, polypropyleneglycol dimethacrylate, 2,2'-bis(4-methacryloxydiethoxyphenyl)propane.

[5] Trimethacrylate Compounds

Trimethylolethane trimethacrylate.

As the "other monomer" to be copolymerized with the crosslinkable monomer there may be mentioned vinyl aromatic compounds such as styrene and α-methylstyrene; unsaturated carboxylic compounds such as acrylic acid and methacrylic acid; and unsaturated dicarboxylic acid anhydrides such as maleic anhydride. In addition there may be mentioned acrylic acid esters such as methyl acrylate, ethyl acrylate and 2-ethylhexyl acrylate, and methacrylic acid esters such as methyl methacrylate, ethyl methacrylate and 2-ethylhexyl methacrylate. The other monomer may be one type used alone, or a combination of two or more types.

The copolymerization of the crosslinkable monomer with the other monomer may be accomplished by any of various methods including solution polymerization, emulsion polymerization and suspension polymerization. The polymerization temperature, polymerization time and other polymerization conditions may be appropriately selected depending on the type of monomers to be copolymerized and other factors such as the desired molecular weight. The reaction may also be carried out with addition of the crosslinkable monomer to the reaction system all at once from the start of copolymerization, or gradual addition to the polymerization system as polymerization progresses. The total monomer content of the crosslinkable monomer used for the copolymerization is preferably 5–80 wt % (hereunder abbreviated to "%"), more preferably 5–60% and even more preferably 7–60%.

The polymer with a crosslinked structure may be one having the structure of a random copolymer, a graft copolymer or a block copolymer. By graft polymerization of a crosslinkable monomer or graft copolymerization of a crosslinkable monomer and another monomer, with polymer particles having an non-crosslinked structure, it is possible to make polymer particles having a crosslinked structure primarily on their surfaces.

The "complexing agent" may be a heterocyclic compound such as benzotriazole, tolyltriazole, thiourea, benzimidazole, benzofloxane, 2,1,3-benzothiadiazole, 2-mercaptobenzothiazole, 2-mercaptobenzothiadiazole, 2-mercaptobenzooxazole or melamine. In addition, salicylaldoxime, o-phenylenediamine, m-phenylenediamine, catechol and o-aminophenol may also be used. These complexing agents may be used in an amount of, with respect to 100 parts by weight of the aqueous dispersion, 0.001–2 parts by weight (hereunder abbreviated to "part(s)"), preferably 0.01–1 part, and more preferably 0.02–0.5 part.

The "compound that can form a passivation film on polishing surfaces" may be selected from the same ones mentioned for the complexing agent.

The "oxidizing agent" may be potassium persulfate, ammonium per-sulfate; hydrogen peroxide, nitric acid, sulfuric acid or the like, with potassium persulfate being particularly preferred. The oxidizing agent may be used in an amount of, with respect to 100 parts of the aqueous dispersion, 0.01–5 parts, preferably 0.1–4 parts and more preferably 0.3–3 parts.

The functional group of the polymer composing the polymer particles of the invention (hereunder referred to as "polymer of the invention") is preferably an amino group, pyridyl group or acrylamide group with amino being particularly preferred among these. The functional group may also be a cationic group.

The polymer of the invention is preferably one synthesized using a specific polymerization initiator that allows introduction of the functional group into the molecule. As such polymerization initiators there may be mentioned 2,2'-azobis-(2-amidinopropane) dihydrochloride (for example, product name "V-50"), 2,2'-azobis-(2-aminopropane) dihydrochloride, azobisisobutyronitrile (for example, product name "V-60"), 1,1'-azobis-(cyclohexane-1-carbonitrile) (for example, product name "V-40"), 2,2'-azobis-(2,4-dimethylvaleronitrile), 2,2'-azobis-(4-methoxy-2,4-dimethylvaleronitrile) (for example, product name "V-70"), and the like. All of the polymerization initiators indicated above by product names are by Wako Junyaku Kogyo Co., Ltd.

As the monomer to be used for synthesis of the polymer using the aforementioned polymerization initiator, there may be mentioned vinyl aromatic compounds such as styrene and α-methylstyrene; unsaturated carboxylic compounds such as acrylic acid and methacrylic acid; and unsaturated dicarboxylic acid anhydrides such as maleic anhydride. In addition there may be mentioned acrylic acid esters such as methyl acrylate, ethyl acrylate and 2-ethylhexyl acrylate, and methacrylic acid esters such as methyl methacrylate, ethyl methacrylate and 2-ethylhexyl methacrylate. These monomers may be used alone or in combinations of two or more.

The synthesis of the polymer using the polymerization initiator specified above may be carried out in the presence of other polymer particles as core particles. The core particles used may particles made of homopolymers or copolymers of the monomers mentioned above, and specific examples include polymer particles made of polystyrene, polymethyl methacrylate and the like.

The amount of the specific polymerization initiator to be used may be 0.1–7 parts, preferably 0.5–4 parts and more preferably 0.5–3 parts, with respect to a total of 100 parts of the monomers used to synthesize the polymer and the polymer particles optionally used as core particles. If the specific polymerization initiator is used at less than 0.1 part, the polishing rate will not be adequately improved. On the other hand, an adequate effect is achieved if the polymerization initiator is used at 7 parts, and there is no need to use a greater amount.

The polymer may also be synthesized using a specific monomer having a functional group as the polymerizing component or copolymerizing component. This will result in a polymer having the specific functional group introduced into the molecule.

The following compounds may be mentioned as the "specific monomer".

(1) Substituted hydroxyalkyl (meth)acrylates such as 3-amino-2-hydroxypropyl (meth)acrylate;

(2) Aminoalkyl group-containing (meth)acrylates such as 2-dimethylaminoethyl (meth)acrylate, 2-diethylaminoethyl (meth)acrylate, 2-dimethylaminopropyl (meth)acrylate and 3-dimethylaminopropyl (meth)acrylate;

(3) Aminoalkoxyalkyl group-containing (meth)acrylates such as 2-(dimethylaminoethoxy)ethyl (meth)acrylate, 2-(diethylaminoethoxy)ethyl (meth)acrylate and 3-(dimethylaminoethoxy)propyl (meth)acrylate;

(4) Ultraviolet-absorbing functional group-containing (meth)acrylates such as 2-(2'-hydroxy-5'-methacryloxyethylphenyl)-2H-benzotriazole and 2-(2'-hydroxy-5'-methacryloxyethyl-3'-t-butylphenyl)-2H-benzotriazole;

(5) Light-stabilizing group-containing (meth)acrylates such as 1,2,2,6,6-pentamethyl-4-piperidyl (meth)acrylate and 2,2,6,6-tetramethyl-4-piperidyl (meth)acrylate;

(6) N-alkyl group-containing (meth)acrylamides such as N-methyl (meth)acrylamide, N-ethyl (meth)acrylamide, N-methyl-N-ethyl (meth)acrylamide, N,N-dimethyl (meth)acrylamide and N,N-diethyl (meth)acrylamide;

(7) N-aminoalkyl group-containing (meth)acrylamides such as N-(2-dimethylaminoethyl) (meth)acrylamide, N-(2-diethylaminoethyl) (meth)acrylamide, N-(2-dimethylaminopropyl) (meth)acrylamide and N-(3-dimethylaminopropyl) (meth)acrylamide;

(8) Vinylpyridines such as 2-vinylpyridine and 4-vinylpyridine;

(9) Amides of unsaturated carboxylic acids, or imides, such as (meth)acrylamide, N-methoxymethyl(meth)acrylamide, N-butoxymethyl(meth)acrylamide, N,N-dimethoxymethyl(meth)acrylamide, N,N'-methylenebis(meth)acrylamide, N,N'-ethylenebis (meth)acrylamide, maleic acid amide and maleimide;

(10) Unsaturated carboxylic acid nitrites such as (meth)acrylonitrile, crotonitrile and cinnamonitrile;

(11) N-methylol-converted unsaturated carboxylamides such as N-methylol(meth)acrylamide and N,N-dimethylol (meth)acrylamide.

These specified monomers may be used alone or in combinations of two or more types. These specific monomers may also be used with any of the monomers mentioned as monomers to be used for synthesis of the polymer.

The polymerization initiator used may be potassium persulfate, ammonium persulfate, 2,2'-azobisisobutyronitrile, hydrogen peroxide or the like. There may also be used any of the polymerization initiators mentioned as the specific polymerization initiator to e used for synthesis of the polymer. The amount of the polymerization initiator to be used may be 0.1–5 parts, preferably 0.5–4 parts and more preferably 103 parts, with respect to 100 parts the monomers used to synthesize the polymer.

The synthesis of the polymer using the aforementioned specific monomer may be carried out in the presence of other polymer particles as core particles. The core particles used may particles made of homopolymers or copolymers of the various monomers such as polystyrene, polymethyl methacrylate and the like.

The amount of the specific monomer to be used may be 0.1–5 parts, preferably 0.5–4 parts and more preferably 1–3 parts, with respect to a total of 100 parts of the monomers used to synthesize the polymer and the polymer particles optionally used as core particles. If the amount of the specific monomer is less than 0.1 part the polishing rate will not be adequately improved. On the other hand, an adequate effect is achieved if the monomer is used at 5 parts, and there is no need to use a greater amount.

The polymer may be produced by any of various common methods such as solution polymerization, emulsion polymerization and suspension polymerization. The polymerization temperature, polymerization time and other polymerization conditions may be appropriately selected depending on the type of monomers used and other factors such as the desired molecular weight.

There are no particular restrictions on the method of preparing the polymer particles according to the invention, but there may be mentioned a method in which the polymer is produced using an aqueous medium or organic solvent, and the resulting polymer is pulverized to make particles of the desired size. There may also be mentioned a method in which the monomer is finely dispersed in an aqueous medium or the like during production of the polymer, and polymer particles of the desired size are made therefrom.

The simplest method for preparing the aqueous dispersion for CMP of the invention is a method in which an aqueous medium is used to produce polymer particles of the desired size, and the aqueous dispersion is used directly in that form. Alternatively, after being separated from the aqueous medium, the produced polymer particles may be redispersed in the medium. This method facilitates adjustment of the amount (concentration) of polymer particles in the aqueous dispersion for CMP. Even when the polymer is produced using an organic solvent, so long as the resulting polymer is in particle form, an aqueous dispersion can be easily prepared by removing the organic solvent by distillation or the like and replacing it with water or an aqueous medium. The "aqueous medium" may be water or a mixture of water and methanol or the like, but water alone is preferred.

The amount of polymer particles in the aqueous dispersion for CMP is preferably 0.1–20 parts, more preferably 0.2–15 parts and even more preferably 0.3–10 parts, with respect to the aqueous dispersion as 100 parts. The polymer particles functioning as abrasive particles preferably have a spherical shape, where a spherical shape means having a roughly spherical shape with no acute angle sections, but it does not necessarily need to be nearly spherical. By using spherical polymer particles it is advantageous to achieve polishing at a sufficient rate while consistently reducing scratches in the polishing surface.

While there is no requirement to include inorganic particles in the aqueous dispersion of the invention, inorganic particles made of a metal oxide such as silica, alumina, titania, zirconia, ceria, iron oxide or manganese oxide may be included so long as scratches and the like are still adequately inhibited. When a metal oxide with oxidizing power such as iron oxide or manganese oxide is used as the inorganic particles, the metal oxide functions as an oxidizing agent. The amount of the oxidizing agent may therefore be reduced, or it may be rendered unnecessary.

The polishing film to be polished by an aqueous dispersion for CMP according to the invention may be any of various working films formed on semiconductor wafers during the manufacturing process for semiconductor devices such as VLSIs, or barrier metal layers made of metals such as tantalum, titanium or the like and their oxides and nitrides. As working films formed on semiconductor wafers there may be mentioned silicon oxide films, amorphous silicon films, polycrystalline silicon films, single-crystal silicon films, silicon nitride films, pure tungsten films, pure aluminum films or pure copper films, as well as alloy films of tungsten, aluminum or copper with another metals. The aqueous dispersion of the invention is particularly useful for polishing of pure copper films and other low hardness films, among the various types of working films.

In recent years, more attention is being focused on achieving lower permittivities of interlayer insulation films for the purpose of improving VLSI performance, and this has led to the development of interlayer insulation films comprising silsesquioxane (permittivity: approximately 2.6–3.0), fluorine-containing $SiO_2$ (permittivity: approximately 3.3–3.5), polyimide-based resins (permittivity: approximately 2.4–3.6, trade name "PIQ" by Hitachi Chemical Industries Co., Ltd.; trade name "FLARE" by Allied Signal Corp. and the like), benzocyclobutene (permittivity: approximately 2.7, trade name "BCB" by Dow Chemical Corp. and the like), hydrogen-containing SOG (permittivity: approximately 2.5–3.5) and organic SOG (permittivity: approximately 2.9, trade name "HSGR7" by Hitachi Chemical Industries Co., Ltd.) and the like. However, because these insulation films have low mechanical strength and are soft and brittle, they tend to produce scratches when included in conventional aqueous dispersions for CMP. The aqueous dispersion of the invention is superior in that it produces few scratches even when the working film is an insulator film of this type.

The polishing of a working film in the manufacturing process for a semiconductor device can be accomplished with a commercially available CMP apparatus (such as Model "LGP510" or "LGP552" by Lapmaster SFT Corporation), which has been used in conventional methods employing inorganic particles as abrasive particles.

After the polishing, it is preferred to remove the residual polymer particles from the polishing surface. The particle removal can be accomplished by a common washing method, and in the case of polymer particles the polishing surface can be heated at high temperature in the presence of oxygen to burn the particles for their removal. As the method for burning there may be mentioned exposure to oxygen plasma, or ashing treatment with plasma whereby oxygen radicals are supplied in a downflow; these allow the residual polymer particles to be easily removed from the polishing surface.

The aqueous dispersion of the invention may also contain various additives as necessary in addition to the polymer particles. This can improve the stability of the dispersion, increase the polishing rate and allow adjustment for different polishing rates in cases where two or more types of polishing films of different hardness are to be polished. Specifically, addition of an alkali metal hydroxide, ammonia, an inorganic acid or an organic acid for adjustment of the pH can improve the dispersability and stability of the aqueous dispersion.

[Embodiments of the Invention]

The present invention will now be explained in greater detail by way of examples.

(1) Synthesis of Polymer Particles

SYNTHESIS EXAMPLE 1

After loading 100 parts of methyl methacrylate, 0.1 part of lauryltrimethylammonium chloride, 2 parts of a polymerization initiator (product name: "V-50" by Wako Junyaku Kogyo CO., LTD.) and 400 parts of ion-exchanged water in a 2-liter volume flask, the contents were heated to 70° C. while stirring under a nitrogen gas atmosphere for 6 hours of polymerization, to obtain polymer particles consisted of a polymethyl methacrylate with amino groups introduced at the ends of the molecule chains. The mean particle size of the polymer particles was 0.24 µm. The polymethyl methacrylate polymerization yield was 97%.

SYNTHESIS EXAMPLE 2

After loading 50 parts of polystyrene particles (core particles) with a mean particle size of 200 nm, 50 parts of methyl methacrylate, 0.1 part of lauryltrimethylammonium chloride, 2 parts of "V-50" and 400 parts of ion-exchanged water in a 2-liter volume flask, the contents were heated to 70° C. while stirring under a nitrogen gas atmosphere for 6 hours of polymerization, to obtain polymer particles. The polymer particles consisted of a polystyrene/polymethyl methacrylate compound polymer wherein the polymethyl methacrylate with amino groups introduced at the ends of the molecule chains were attached to the surface of the polystyrene particles. The mean particle size of the polymer particles was 0.27 µm. The polymethyl methacrylate polymerization yield was 97%.

SYNTHESIS EXAMPLE 3

After loading 90 parts of polystyrene particles (core particles) with a mean particle size of 200 nm, 8 parts of methyl methacrylate, 2 parts of 3-amino-2-hydroxypropylmethacrylate, 0.2 part of lauryltrimethylammonium chloride, 0.2 part of cumene hydroperoxide, 0.1 part of potassium ascorbate and 400 parts of ion-exchanged water in a 2-liter volume flask, the contents were heated to 70° C. while stirring under a nitrogen gas atmosphere for 6 hours of polymerization, to obtain polymer particles. The polymer particles consisted of a compound polymer of polystyrene/methacrylate-based copolymer, wherein the methacrylate-based copolymer with amino groups in the molecule chains were attached to the surface of the polystyrene particles. The mean particle size of the polymer particles was 0.25 µm. The methacrylate-based copolymer polymerization yield was 98%.

SYNTHESIS EXAMPLE 4

After loading 97 parts of methyl methacrylate, 3 parts of 3-amino-2-hydroxypropyl methacrylate, 0.15 part of lauryltrimethylammonium chloride, 0.2 part of cumene hydroperoxide, 0.1 part of potassium ascorbate and 400 parts of ion-exchanged water in a 2-liter volume flask, the contents were heated to 70° C. while stirring under a nitrogen gas atmosphere for 6 hours of polymerization, to obtain polymer particles composed of a methacrylic-based copolymer with amino groups in the molecule chains. The mean particle size of the polymer particles was 0.23 μm. The methacrylate-based copolymer polymerization yield was 97%.

SYNTHESIS EXAMPLE 5

After loading 95 parts of methyl methacrylate, 5 parts of divinylbenzene, 0.1 part of lauryltrimethylammonium chloride, 2 parts of "V-50" and 400 parts of ion-exchanged water in a 2-liter volume flask, the contents were heated to 70° C. while stirring under a nitrogen gas atmosphere for 6 hours of polymerization, to obtain particles composed of a polymer with a crosslinked structure having amino groups introduced at the ends of the molecule chains. The mean particle size of the polymer particles was 0.22 μm. The polymethyl methacrylate polymerization yield was 96%.

SYNTHESIS EXAMPLE 6

After loading 50 parts of polystyrene with a mean particle size of 200 nm and 400 parts of ion-exchanged water in a 2-liter volume flask, the contents were heated to 70° C. while stirring under a nitrogen gas atmosphere. A mixture comprising 40 parts of methyl methacrylate, 10 parts of trimethylolpropane trimethacrylate, 0.1 part of lauryltrimethylammonium chloride and 1.5 parts of "V-50" was then added over a period of 4 hours at a fixed addition rate. After the addition, polymerization was carried out for 2 hours to obtain particles composed of a compounded polymer with a crosslinked structure, wherein the polymethyl methacrylate with amino groups introduced at the ends of the molecule chains were attached to the surface of the polystyrene particles. The mean particle size of the polymer particles was 0.20 μm. The polymethyl methacrylate polymerization yield was 95%.

COMPARATIVE SYNTHESIS EXAMPLE 1

Polymer particles were obtained in the same manner as Synthesis Example 1, except that ammonium persulfate was used as the polymerization initiator instead of "V-50", and ammonium lauryl sulfate was used instead of lauryltrimethylammonium chloride. The mean particle size of the polymer particles was 0.25 μm. The polymethyl methacrylate polymerization yield was 98%.

COMPARATIVE SYNTHESIS EXAMPLE 2

Polymer particles were obtained in the same manner as Synthesis Example 2, except that ammonium persulfate was used as the polymerization initiator instead of "V-50", and ammonium lauryl sulfate was used instead of lauryltrimethylammonium chloride. The mean particle size of the polymer particles was 0.24 μm. The polymethyl methacrylate polymerization yield was 97%.

COMPARATIVE SYNTHESIS EXAMPLE 3

Polymer particles were obtained in the same manner as Synthesis Example 3, except that acrylic acid was used instead of 3-amino-2-hydroxypropyl methacrylate and ammonium lauryl sulfate was used instead of lauryltrimethylammonium chloride. The mean particle size of the polymer particles was 0.23 μm. The methyl methacrylate-acrylic acid copolymer polymerization yield was 97%.

COMPARATIVE SYNTHESIS EXAMPLE 4

Polymer particles composed of a polymer with a crosslinked structure were obtained in the same manner as Synthesis Example 5, except that ammonium persulfate was used as the polymerization initiator instead of "V-50", and ammonium lauryl sulfate was used instead of lauryltrimethylammonium chloride. The mean particle size of the polymer particles was 0.25 μm. The polymethyl methacrylate polymerization yield was 98%.

COMPARATIVE SYNTHESIS EXAMPLE 5

Polymer particles composed of a polymer with a crosslinked structure were obtained in the same manner as Synthesis Example 6, except that ammonium persulfate was used as the polymerization initiator instead of "V-50", and ammonium lauryl sulfate was used instead of lauryltrimethylammonium chloride. The mean particle size of the polymer particles was 0.24 μm. The polymethyl methacrylate polymerization yield was 97%.

Formation of Low Permittivity Porous Insulator Film

An insulator film for a polishing test was formed on an ITO wafer by the following method.

A mixed solution comprising 101.5 g of methyltrimethoxysilane, 276.8 g of methyl methoxypropionate and 9.7 g of tetraisopropoxytitanium/ethyl acetoacetate complex was heated to 60° C., and a mixture of 112.3 g of γ-butyrolactone and water (weight ratio: 4.58) was added to the mixed solution dropwise over an hour. After completion of the dropwise addition, reaction was conducted at 60° C. for one hour to obtain a polysiloxane sol.

After mixing 15 g of the polysiloxane sol with 1 g of polystyrene particles, the mixture was coated onto an ITO wafer by spin coating to form a coating with a thickness of 1.39 μm. This was heated at 80° C. for 5 minutes and then at 200° C. for 5 minutes, and then heated at 340° C., 360° C. and 380° C. for 30 minutes each in that order under vacuum and finally heated at 450° C. for one hour to form a colorless transparent coating.

Observation of a cross-section of the coating with a scanning electron microscope confirmed formation of fine pores. The permittivity of the coating was 1.98, the elastic modulus was 3 GPa, and the void volume was 15%. This coating will hereunder be referred to as the "LKD film".

(2) Preparation and Evaluation of Aqueous Dispersion for CMP

EXAMPLE 1

Aqueous Dispersion Containing Polymer Particles of Synthesis Example 1

The polymer particles obtained in Synthesis Example 1 were mixed with ion-exchanged water to a concentration of 2.0 wt % (hereunder abbreviated to "%"), and then potassium persulfate was added to a concentration of 0.5% and the pH was adjusted to 8.2 with potassium hydroxide to prepare an aqueous dispersion.

EXAMPLE 2-[1] and [2]

Aqueous Dispersions Containing Polymer Particles of Synthesis Example 1

An aqueous dispersion was prepared having a different polymer particle content than Example 1.

Specifically, an aqueous dispersion was prepared in the same manner as Example 1 except that the polymer particles obtained in Synthesis Example 1 were added to concentrations of 1.0% (Example 2-[1]) and 3.0% (Example 2-[2]).

A copper film-coated wafer (film thickness: 15,000 Å) was polished using the aqueous dispersions prepared in Example 1, Example 2-[1] and Example 2-[2], and the presence of scratches, the polishing rate and the etching rate were evaluated by the methods described below. The results are shown in Table 1 and FIG. 1.

[1] Presence of Scratches

The polishing surface was washed and dried, and the presence of any scratches was confirmed with a differential interference microscope.

[2] Polishing Rate

A small-sized CMP apparatus (Model "LM-15" by Lapmaster SFT Corporation) was used for polishing under the following conditions (Polishing conditions (A)) and the polishing rate was calculated according to the formula given below.

(Polishing Conditions (A))
Table rotation and head rotation speed: 45 rpm
Polishing load: 233 g/cm$^2$
Polishing material supply rate: 50 cc/min.
Polishing time: 3 min.
Polishing pad: Porous polyurethane (Two-layer structure of Product Nos. "IC1000"/"SUBA400", Rodel-Nitta Corporation)

Polishing rate (Å/min)=[(thickness of copper film before polishing)−(thickness of copper film after polishing)]/(polishing time)

[3] Etching Rate

A copper-coated wafer cut to a 2 cm×2 cm size was immersed in the aqueous dispersion for 30 minutes, and the thickness of the copper film before and after immersion was measured to calculate the etching rate according to the following formula.

Etching rate (Å/min)=[(thickness of copper film before immersion)−(thickness of copper film after immersion)]/(immersing time)

The LKD film formed by the above-mentioned method was set in a CMP apparatus (Model "LPG510" by Lapmaster SFT Corporation), and a porous polyurethane polishing pad (Product No. "IC1000" by Rodel-Nitta Corporation) was used for one minute of polishing under a load of 0.03 MPa. The polishing surface was washed and dried, and the presence of any scratches was confirmed in the same manner as the copper film.

As a result of the above evaluation, no scratches were observed in the copper or LKD polishing films with any of the aqueous dispersions of Example 1 and Examples 2-[1] and 2-[2], regardless of the polymer particle concentration. According to the results shown in FIG. 1, addition of the polymer particles to a concentration of 1% drastically increased the polishing rate, and the polishing rate tended to increase even further with even greater content. Addition of the polymer particles to a concentration of 1% also resulted in a considerably lower etching rate compared to when they were absent, i.e. to a suitable etching rate of 75 Å/min, while even a greater polymer particle content maintained about the same etching rate.

EXAMPLES 3–5

Aqueous Dispersions Containing Polymer Particles of Synthesis Examples 2–4

The polymer particles obtained in Synthesis Examples 2–4 and potassium persulfate were added to ion-exchanged water to concentrations of 2% and 0.5% respectively, and the pH was adjusted with potassium hydroxide as shown in Table 1 to prepare aqueous dispersions.

EXAMPLE 6

Aqueous Dispersion Containing Polymer Particles of Synthesis Example 1

The polymer particles obtained in Synthesis Example 1 were added to ion-exchanged water to a concentration of 1.5%. Hydrogen peroxide water was added instead of potassium persulfate to a hydrogen peroxide concentration of 5% in the aqueous dispersion, and the pH was adjusted with potassium hydroxide to prepare an aqueous dispersion.

COMPARATIVE EXAMPLES 1–3

Aqueous Dispersions Containing Polymer Particles of Comparative Synthesis Examples 1–3

The polymer particles obtained in Comparative Synthesis Examples 1–3 were used, the polymer particles and potassium persulfate were added to ion-exchanged water to concentrations of 2% and 0.5% respectively, and the pH was adjusted with potassium hydroxide to prepare aqueous dispersions.

COMPARATIVE EXAMPLE 4

Aqueous Dispersion Containing No Particles

Potassium persulfate was added to ion-exchanged water to a concentration of 0.5%, and the pH was adjusted to 8.3 with potassium hydroxide to prepare an aqueous dispersion. This aqueous dispersion contained no particles.

COMPARATIVE EXAMPLE 5

Aqueous Dispersion Containing Silica Particles

After placing 50 g of fumed silica particles (product name: "Aerosil #50", Nihon Aerosil CO., LTD.) in a 2-liter volume polyethylene bottle, 500 g of ion-exchanged water was added and the particles were dispersed with an ultrasonic disperser to prepare an aqueous dispersion containing fumed silica particles. After then adding 167 g of a 3% potassium persulfate aqueous solution, the mixture was thoroughly stirred. The pH was then adjusted to 8.0 with a potassium hydroxide aqueous solution, and ion-exchanged water was charged in to an amount giving a total of 1 kg. This was then thoroughly stirred and filtered with a 5-μm pore filter to obtain an aqueous dispersion.

The aqueous dispersions of Examples 3–6 and Comparative Examples 1–5 were used to evaluate the presence of any scratches and the etching rate, in the same manner as Examples 1 and 2. A CMP apparatus (Model "LGP510" by Lapmaster SFT Corporation) was used to polish a copper-coated wafer under the following conditions (Polishing conditions (B)), and the polishing rate was calculated according to the formula given above.

(Polishing Conditions (B))
Table rotation and head rotation speed: 50 rpm
Polishing load: 300 g/cm$^2$
Polishing material supply rate: 100 cc/min.
Polishing time: 1 min.
Polishing pad: Porous polyurethane (Two-layer structure of Product Nos. "IC1000"/"SUBA400", Rodel-Nitta Corporation)

An LKD film was also polished in the same manner as Example 1, and the presence of any scratches was confirmed. The evaluation results are shown in Table 1.

TABLE 1

| | aqueous dispersions | | | copper film | | | |
| --- | --- | --- | --- | --- | --- | --- | --- |
| | polymer particles (concentration) | oxidizing agent (concentration) | pH | polishing rate (Å/min) | etching rate (Å/min) | scratches | LKD film scratches |
| Examples | | | | | | | |
| 1 | Synthesis Example 1 (2%) | KPS (0.5%) | 8.2 | 5300 | 75 | none | none |
| 2-[1] | Synthesis Example 1 (1%) | KPS (0.5%) | 8.2 | 4200 | 75 | none | none |
| 2-[2] | Synthesis Example 1 (3%) | KPS (0.5%) | 8.2 | 5700 | 75 | none | none |
| 3 | Synthesis Example 2 (2%) | KPS (0.5%) | 7.5 | 4400 | 55 | none | none |
| 4 | Synthesis Example 3 (2%) | KPS (0.5%) | 7.7 | 4600 | 50 | none | none |
| 5 | Synthesis Example 4 (2%) | KPS (0.5%) | 8.0 | 5150 | 55 | none | none |
| 6 | Synthesis Example 1 (1.5%) | $H_2O_2$ (5.0%) | 8.3 | 3490 | 40 | none | none |
| Comparative Examples | | | | | | | |
| 1 | Comparative Synthesis Example 1 (2%) | KPS (0.5%) | 8.1 | 150 | 45 | none | none |
| 2 | Comparative Synthesis Example 2 (2%) | KPS (0.5%) | 7.5 | 170 | 42 | none | none |
| 3 | Comparative Synthesis Example 3 (2%) | KPS (0.5%) | 8.0 | 210 | 50 | none | none |
| 4 | — | KPS (0.5%) | 8.3 | 30 | 230 | a few scratches were seen | none |
| 5 | (fumed silica) (2%) | KPS (0.5%) | 8.1 | 750 | 135 | scratches were seen | none |

According to the results in Table 1, no scratches were seen upon polishing either the copper film or LKD film with any of the aqueous dispersions of Examples 3–6, and the balance between polishing rate and etching rate was also excellent. On the other hand, while there were no scratches with any of the aqueous dispersions of Comparative Examples 1–3, they had very low polishing rates. With the aqueous dispersion of Comparative Example 4, a few scratches were seen and the polishing rate was very low while the etching rate was very high. With the aqueous dispersion of Comparative Example 5, scratches were seen, the polishing rate was low and the etching rate was considerably high.

EXAMPLE 7

Preparation of Aqueous Dispersion Containing Polymer Particles of Synthesis Example 5

The polymer particles obtained in Synthesis Example 5 were added to ion-exchanged water to a concentration of 2.0%, and then potassium persulfate and salicylaldoxime were added to concentrations of 0.5% and 0.1% respectively and the pH was adjusted to 8.3 with potassium hydroxide to prepare an aqueous dispersion.

EXAMPLE 8

Preparation of Aqueous Dispersion Containing Polymer Particles of Synthesis Example 6

An aqueous dispersion was prepared in the same manner as Example 7, except that the polymer particles of Synthesis Example 6 were used instead of the polymer particles of Synthesis Example 5, and benzotriazole was added to a concentration of 0.02% instead of salicylaldoxime.

EXAMPLE 9

Preparation of Aqueous Dispersion Containing Polymer Particles of Synthesis Example 5

An aqueous dispersion was prepared in the same manner as Example 7, except that the polymer particles of Synthesis Example 5 were added to a concentration of 3.5%, quinaldinic acid was added to a concentration of 0.5% instead of salicylaldoxime, and the pH was adjusted to 9.1.

EXAMPLE 10

Preparation of Aqueous Dispersion Containing Polymer Particles of Synthesis Example 5

An aqueous dispersion was prepared in the same manner as Example 9, except that the polymer particles of Synthesis Example 5, potassium persulfate and quinaldinic acid were added to concentrations of 0.5%, 0.8% and 0.4% respectively, and the pH was adjusted to 9.0.

EXAMPLE 11

Preparation of Aqueous Dispersion Containing Polymer Particles of Synthesis Example 6

The polymer particles obtained in Synthesis Example 6 were added to ion-exchanged water to a concentration of 2.0%, and then potassium persulfate and 7-hydroxy-5-methyl-1,3,4-triazaindolizine were added to concentrations of 0.5% and 0.4% respectively and the pH was adjusted to 8.6 with potassium hydroxide to prepare an aqueous dispersion.

EXAMPLE 12

Preparation of Aqueous Dispersion Containing Polymer Particles of Synthesis Example 5

An aqueous dispersion was prepared in the same manner as Example 11, except that the polymer particles of Synthesis Example 5 were used in instead of the polymer particles of Synthesis Example 6, hydrogen peroxide water was used instead of potassium persulfate to a hydrogen peroxide concentration of 5% in the aqueous dispersion, and the pH was adjusted to 8.9.

EXAMPLE 13

Preparation of Aqueous Dispersion Containing Polymer Particles of Synthesis Example 1

The polymer particles obtained in Synthesis Example 1 were added to ion-exchanged water to a concentration of 2.0%, and then potassium persulfate and quinaldinic acid were added to concentrations of 1.0% and 0.3% respectively and the pH was adjusted to 9.0 with potassium hydroxide to prepare an aqueous dispersion.

EXAMPLE 14

Preparation of Aqueous Dispersion Containing Polymer Particles of Synthesis Example 2

An aqueous dispersion was prepared in the same manner as Example 13, except that the polymer particles of Synthesis Example 2 were added to a concentration of 3.0% instead of the polymer particles of Synthesis Example 1, 7-hydroxy-5-methyl-1,3,4-triazaindolizine was added to a concentration of 0.5% instead of quinaldinic acid, and the pH was adjusted to 8.5.

EXAMPLE 15

Preparation of Aqueous Dispersion Containing Polymer Particles of Synthesis Example 3

An aqueous dispersion was prepared in the same manner as Example 13, except that the polymer particles of Synthesis Example 3 were used instead of the polymer particles of Synthesis Example 1, salicylaldoxime was added to a concentration of 0.2% instead of quinaldinic acid, and the pH was adjusted to 8.5.

EXAMPLE 16

Preparation of Aqueous Dispersion Containing Polymer Particles of Synthesis Example 4

An aqueous dispersion was prepared in the same manner as Example 13, except that the polymer particles of Synthesis Example 4 were added to a concentration of 3.0% instead of the polymer particles of Synthesis Example 1, the quinaldic acid concentration was 0.2%, and the pH was adjusted to 9.1.

COMPARATIVE EXAMPLE 6

Preparation of Aqueous Dispersion Containing Polymer Particles of Comparative Synthesis Example 4

An aqueous dispersion was prepared in the same manner as Example 7, except that the polymer particles obtained in Comparative Synthesis Example 4 were used, and no salicylaldoxime was added.

COMPARATIVE EXAMPLE 7

Preparation of Aqueous Dispersion Containing Polymer Particles of Comparative Synthesis Example 5

An aqueous dispersion was prepared in the same manner as Example 8, except that the polymer particles obtained in Comparative Synthesis Example 5 were used, and no benzotriazole was added.

A copper film-coated wafer (film thickness: 15,000 Å) was polished in the same manner as Examples 1 and 2 using the aqueous dispersions of Examples 7–16 and Comparative Examples 6 and 7, and the polishing rate, etching rate and presence of scratches under polishing conditions (A) were evaluated. An LKD film was also polished in the same manner as Example 1, and the presence of any scratches was confirmed. The evaluation results are shown in Table 2.

In the examples and comparative examples described above, the copper film thickness was determined by measuring the sheet resistance by the direct current 4-probe method using a resistivity measuring instrument (Model "Σ-5" by NPS Corp.) and calculating the thickness from the sheet resistance value and the copper resistivity based on the following formula.

Copper film thickness (Å)=[sheet resistance value $(\Omega/cm^2)\times$copper resistivity $(\Omega/cm)]\times 10^8$

TABLE 2

| | aqueous dispersions | | | | copper film | | | |
|---|---|---|---|---|---|---|---|---|
| | polymer particles (concentration) | oxidizing agent (concentration) | complexing agent (concentration) | pH | polishing rate (Å/min) | etching rate (Å/min) | scratches | LKD film scratches |
| Examples | | | | | | | | |
| 7 | Synthesis Example 5 (2%) | KPS (0.5%) | salicyl-aldoxime (0.5%) | 8.3 | 2300 | 15 | none | none |
| 8 | Synthesis Example 6 (2%) | KPS (0.5%) | BTA (0.02%) | 8.3 | 2550 | 10 | none | none |
| 9 | Synthesis Example 5 (3.5%) | KPS (0.5%) | quinaldic acid (0.5%) | 9.1 | 2850 | 15 | none | none |
| 10 | Synthesis Example 5 (0.5%) | KPS (0.8%) | quinaldic acid (0.4%) | 9.0 | 2430 | 13 | none | none |
| 11 | Synthesis Example 6 (2%) | KPS (0.5%) | HMT (0.4%) | 8.6 | 3050 | 17 | none | none |
| 12 | Synthesis Example 5 (2%) | $H_2O_2$ (5.0%) | HMT (0.4%) | 8.9 | 2660 | 16 | none | none |
| 13 | Synthesis Example 1 (2%) | KPS (1.0%) | quinaldic acid (0.3%) | 9.0 | 2150 | 10 | none | none |
| 14 | Synthesis Example 2 (3%) | KPS (1.0%) | HMT (0.5%) | 8.5 | 1950 | 5 | none | none |
| 15 | Synthesis Example 3 (2%) | KPS (1.0%) | salicyl-aldoxime (0.2%) | 8.5 | 2010 | 15 | none | none |
| 16 | Synthesis Example 4 (3%) | KPS (1.0%) | quinaldic acid (0.2%) | 9.1 | 1850 | 5 | none | none |
| Comparative Examples | | | | | | | | |
| 6 | Comparative Synthesis Example 4 (2%) | KPS (0.5%) | — | 8.3 | 150 | 15 | none | none |
| 7 | Comparative Synthesis Example 5 (2%) | KPS (0.5%) | — | 8.3 | 170 | 15 | none | none |

BTA; benzotriazole
HMT; 7-hydroxy-5-methyl-1,3,4-triazaindolizine

According to the results in Table 2, adequate polishing rate was achieved with the aqueous dispersions of Examples 7–16, and the etching rate was also within the preferred range. And no scratching was found upon polishing the copper films or LKD films. However, while the aqueous dispersions of Comparative Examples 6 and 7 exhibited no problems in terms of scratches or etching rate, their polishing rates were very low.

What is claimed is:

1. A chemical mechanical polishing process comprising:
polishing a polishing film with an aqueous chemical mechanical polishing dispersion comprising particles and water;
wherein said particles consist of polymer particles consisting of a polymer having at least one functional group which can react with a metal of a polishing surface of the polishing film, and said polymer consists of polymerized units of (i) at least one monomer (A) selected from the group consisting of 3-amino-2-hydroxypropyl (meth)acrylate, aminoalkyl group-containing (meth)acrylates, aminoalkoxyalkyl group-containing (meth)acrylates, 2-(2'-hydroxy-5'-methacryloxyethylphenyl)-2H-benzotriazole, 2-(2'-hydroxy-5-methacryloxyethyl-3'-t-butylphenyl)-2H-benzotriazole, 1,2,2,6,6-pentamethyl-4-piperidyl (meth)acrylate, 2,2,6,6-tetramethyl-4-piperidyl (meth)acrylate, N-alkyl group-containing (meth)acrylamides, N-aminoalkyl group-containing (meth)acrylamides, vinylpyridines, amides of unsaturated carboxylic acids, imides of unsaturated carboxylic acids, and N-methylol-converted unsaturated carboxylamides, and (ii) one or more other polymerizable unsaturated monomers (B) selected from the group consisting of a vinyl aromatic compound, an unsaturated carboxylic compound, an unsaturated dicarboxylic acid anhydride, an acrylic acid ester and a methacrylic acid ester,
wherein the polymer particles are present in the aqueous dispersion in an amount of from 1 to 3% by weight based on the total weight of the aqueous dispersion.

2. The process according to claim 1, wherein said polymer has a crosslinked structure.

3. The process according to claim 1, wherein said aqueous dispersion further comprises a complexing agent.

4. The process according to claim 3, wherein said complexing agent is at least one compound selected from the group consisting of quinaldinic acid, 7-hydroxy-5-methyl-1,3,4-triazaindolizine, benzotriazole, tolyltriazole, thiourea, benzimidazole, benzofloxane, 2,1,3-benzothiadiazole, 2-mercaptobenzothiazole, 2-mercaptobenzothiadiazole, 2-mercaptobenzooxazole, melamine, salicylaldoxime, o-phenylenediamine, m-phenylenediamine, catechol and o-aminophenol.

5. The process according to claim 1, wherein said aqueous dispersion further comprises a compound that can form a passivation film on the polishing surface.

6. The process according to claim 5, wherein said compound that can form a passivation film is at least one compound selected from the group consisting of quinaldinic acid, 7-hydroxy-5-methyl-1,3,4-triazaindolizine, benzotriazole, tolyltriazole, thiourea, benzimidazole, benzofloxane, 2,1,3-benzothiadiazole, 2-mercaptobenzothiazole, 2-mercaptobenzothiadiazole, 2-mercaptobenzooxazole, melamine, salicylaldoxime, o-phenylenediamine, m-phenylenediamine, catechol and o-aminophenol.

7. The process according to claim 1, wherein said aqueous dispersion further comprises an oxidizing agent.

8. The process according to claim 1, wherein said functional group is at least one selected from the group consisting of an amino group, a pyridyl group and an acrylamide group.

9. The process according to claim 1, wherein the monomer (A) is at least one selected from the group consisting of 3-amino-2-hydroxypropyl methacrylate, aminoalkyl group-containing methacrylates, aminoalkoxyalkyl group-containing methacrylates, 1,2,2,6,6-pentamethyl-4-piperidyl methacrylate, and 2,2,6,6-tetramethyl-4-piperidyl methacrylate.

10. The process according to claim 1, wherein at least one of the monomer (B) is a styrene and at least one of the monomer (A) is selected from the group consisting of 3-amino-2-hydroxypropyl methacrylate, aminoalkyl group-containing methacrylates, aminoalkoxyalkyl group-containing methacrylates, 1,2,2,6,6-pentamethyl-4-piperidyl methacrylate, and 2,2,6,6-tetramethyl-4-piperidyl methacrylate.

11. The process according to claim 1, wherein at least one of the monomer (A) is 3-amino-2-hydroxypropyl (meth)acrylate.

12. The process according to claim 1, wherein at least one of the monomer (B) is a divinyl benzene and at least one of the monomer (A) is selected from the group consisting of 3-amino-2-hydroxypropyl methacrylate, aminoalkyl group-containing methacrylates, aminoalkoxyalkyl group-containing methacrylates, 1,2,2,6,6-pentamethyl-4-piperidyl methacrylate, and 2,2,6,6-tetramethyl-4-piperidyl methacrylate, and the polymer is cross-linked.

13. The process according to claim 1, wherein the aqueous chemical mechanical polishing dispersion further comprises a complexing agent in an amount of from 0.02 to 0.5% and an oxidizing agent in an amount of from 0.5 to 5%, wherein % is % by weight based on the total weight of the aqueous dispersion,
the polishing is carried out at a pH of from 7.5 to 9.1, and
the polymer contains polymerized units of 3-amino-2-hydroxypropyl (meth)acrylate.

14. The process according to claim 1, wherein the polishing is carried out on a polishing film having a low permittivity porous insulator film.

15. The process according to claim 1, wherein the polymer has at least one amino functional group.

16. The process according to claim 1, wherein the polishing film is a copper film.

17. A chemical mechanical polishing process comprising:
polishing a polishing film with an aqueous chemical mechanical polishing dispersion comprising particles and water;
wherein said particles consist of polymer particles consisting of a core and a polymer attached to the surface of the core,
wherein the polymer has at least one functional group which can react with a metal of a polishing surface of the polishing film, and
wherein the polymer consists of polymerized units of (i) at least one monomer (A) selected from the group consisting of 3-amino-2-hydroxypropyl (meth)acrylate, aminoalkyl group-containing (meth)acrylates, aminoalkoxyalkyl group-containing (meth)acrylates, 2-(2'-hydroxy-5'-methacryloxyethylphenyl)-2H-benzotriazole, 2-(2'-hydroxy-5'-methacryloxyethyl-3'-t-butylphenyl)-2H-benzotriazole, 1,2,2,6,6-pentamethyl-4-piperidyl (meth)acrylate, 2,2,6,6-tetramethyl-4-piperidyl (meth)acrylate, N-alkyl group-containing (meth)acrylamides, N-aminoalkyl group-containing (meth)acrylamides, vinylpyridines, amides of unsaturated carboxylic acids, imides of unsaturated carboxylic acids, and N-methylol-converted unsaturated carboxylamides, and (ii) one or more other polymerizable unsaturated monomers (B) selected from the group consisting of a vinyl aromatic compound, an unsaturated carboxylic compound, an unsaturated dicarboxylic acid anhydride, an acrylic acid ester and a methacrylic acid ester,
wherein the core consists of a homopolymer or a copolymer consisting of at least one of the monomers A and B, and
wherein the polymer particles are present in the aqueous dispersion in an amount of from 1 to 3% by weight based on the total weight of the aqueous dispersion.

18. The process according to claim 17, wherein the polymer has a crosslinked structure.

19. The process according to claim 17, wherein said aqueous dispersion further comprises a complexing agent.

20. The process according to claim 19, wherein said complexing agent is one compound selected from the group consisting of quinaldinic acid, 7-hydroxy-5-methyl-1,3,4-triazaindolizine, benzotriazole, tolyltriazole, thiourea, benzimidazole, benzofloxane, 2,1,3-benzothiadiazole, 2-mercaptobenzothiazole, 2-mercaptobenzooxazole, mealamine, salicylaldoxime, o-phenylenediamine, m-phenylenediamine, catechol, and o-aminophenol.

21. The process according to claim 17, wherein said aqueous dispersion further comprises an oxidizing agent.

22. The process according to claim 17, wherein the polymer particles are obtained by polymerizing the monomers of the polymer in the presence of the core particles.

23. The process according to claim 17, wherein the polishing film is a copper film.

24. The process according to claim 17, wherein said functional group is at least one selected from the group consisting of an amino group, a pyridyl group and an acrylamide group.

25. The process according to claim 17, wherein the monomer (A) is at least one selected from the group consisting of 3-amino-2-hydroxypropyl methacrylate, aminoalkyl group-containing methacrylates, aminoalkoxyalkyl group-containing methacrylates, 1,2,2,6,6-pentamethyl-4-piperidyl methacrylate, and 2,2,6,6-tetramethyl-4-piperidyl methacrylate.

26. The process according to claim 17, wherein at least one of the monomer (B) is a styrene and at least one of the monomer (A) is selected from the group consisting of 3-amino-2-hydroxypropyl methacrylate, aminoalkyl group-containing methacrylates, aminoalkoxyalkyl group-containing methacrylates, 1,2,2,6,6-pentamethyl-4-piperidyl methacrylate, and 2,2,6,6-tetramethyl-4-piperidyl methacrylate.

27. The process according to claim 17, wherein at least one of the monomer (A) is 3-amino-2-hydroxypropyl (meth)acrylate.

28. The process according to claim 17, wherein at least one of the monomer (B) is a divinyl benzene and at least one of the monomer (A) is selected from the group consisting of 3-amino-2-hydroxypropyl methacrylate, aminoalkyl group-containing methacrylates, aminoalkoxyalkyl group-containing methacrylates, 1,2,2,6,6-pentamethyl-4-piperidyl methacrylate, and 2,2,6,6-tetramethyl-4-piperidyl methacrylate, and the polymer is cross-linked.

29. The process according to claim 17, wherein the aqueous chemical mechanical polishing dispersion further comprises a complexing agent in an amount of from 0.02 to 0.5% and an oxidizing agent in an amount of from 0.5 to 5%, wherein % is % by weight based on the total weight of the aqueous dispersion, the polishing is carried out at a pH of from 7.5 to 9.1, and the monomer (A) is 3-amino-2-hydroxypropyl (meth)acrylate.

* * * * *